(12) United States Patent
Cheng

(10) Patent No.: US 12,376,355 B2
(45) Date of Patent: Jul. 29, 2025

(54) GAN-BASED SEMICONDUCTOR STRUCTURES

(71) Applicant: ENKRIS SEMICONDUCTOR, INC., Jiangsu (CN)

(72) Inventor: Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 488 days.

(21) Appl. No.: 17/827,156

(22) Filed: May 27, 2022

(65) Prior Publication Data

US 2023/0080538 A1 Mar. 16, 2023

(30) Foreign Application Priority Data

Sep. 15, 2021 (CN) .......................... 202111081591.6

(51) Int. Cl.
*H01L 29/20* (2006.01)
*H01L 29/417* (2006.01)
(Continued)

(52) U.S. Cl.
CPC ......... *H10D 62/126* (2025.01); *H10D 30/015* (2025.01); *H10D 30/475* (2025.01); *H10D 62/125* (2025.01); *H10D 62/151* (2025.01); *H10D 62/161* (2025.01); *H10D 62/8503* (2025.01); *H10D 64/256* (2025.01); *H10D 62/343* (2025.01)

(58) Field of Classification Search
CPC ............. H01L 29/0688; H01L 29/0692; H01L 29/2003; H01L 29/41766; H01L 29/66462; H01L 29/778–7789; H10D 62/125; H10D 62/126; H10D 62/8503; H10D 62/881; H10D 64/256; H10D 64/2527; H10D 30/015; H10D 30/47; H10D 30/471; H10D 30/472; H10D 30/473; H10D 30/4732; H10D 30/4735; H10D 30/4738; H10D 30/474; H10D 30/475; H10D 30/4755; H10D 30/476; H10D 30/477; H10D 30/478; H10D 30/481; H10D 30/485; H10D 30/501; H10D 30/502; H10D 30/503; H10D 30/504; H10D 30/5065; H10D 30/508; H10D 30/509

See application file for complete search history.

(56) References Cited

U.S. PATENT DOCUMENTS

| 2014/0014966 | A1* | 1/2014 | Tabatabaie | ........... | H10D 62/149 |
| | | | | | 257/E29.089 |
| 2018/0358458 | A1* | 12/2018 | Iucolano | ............... | H10D 30/475 |
| 2022/0376084 | A1* | 11/2022 | Hao | ...................... | H10D 62/115 |

* cited by examiner

*Primary Examiner* — Victoria K. Hall
(74) *Attorney, Agent, or Firm* — The Small Patent Law Group LLC; Christopher R. Carroll

(57) ABSTRACT

The present disclosure provides a GaN-based semiconductor structure, including: a substrate; a channel layer; a barrier layer, where the channel layer and the barrier layer each include a channel region, a source region and a drain region; one or more grooves provided in at least one of the source region or the drain region, where, for each of the grooves, a length of a first side edge adjacent to the channel region and located on a bottom wall of the groove is larger than a length of an orthographic projection of the first side edge on a vertical plane in a length direction of the channel region; a source region N-type ion heavily-doped layer and a drain region N-type ion heavily-doped layer; and a gate electrode, a source electrode, and a drain electrode.

11 Claims, 10 Drawing Sheets

(51) Int. Cl.
*H01L 29/66* (2006.01)
*H01L 29/778* (2006.01)
*H10D 30/01* (2025.01)
*H10D 30/47* (2025.01)
*H10D 62/10* (2025.01)
*H10D 62/13* (2025.01)
*H10D 62/85* (2025.01)
*H10D 64/23* (2025.01)
*H10D 62/17* (2025.01)

GAN-BASED SEMICONDUCTOR STRUCTURES

CROSS-REFERENCE TO RELATED APPLICATIONS

This application claims priority to Chinese Patent Application No. 202111081591.6 filed on Sep. 15, 2021, the entire content of which is incorporated herein by reference.

TECHNICAL FIELD

The present disclosure relates to the field of semiconductor technologies, and in particular, to GaN-based semiconductor structures.

BACKGROUND

Wide band-gap semiconductor materials, such as GaN-based materials, as a typical representative of a third generation of semiconductor materials have excellent characteristics of large band gap, high pressure resistance, high temperature resistance, high electron saturation and drift velocity, and easy formation of high-quality heterostructures, and are very suitable for manufacturing high-temperature, high-frequency, high-power electronic devices. In recent years, research on GaN-based HEMT (High Electron Mobility Transistor) microelectronic devices have achieved remarkable results and rapid development.

However, on-resistance of the GaN-based HEMT microelectronic devices is relatively large.

SUMMARY

The present disclosure provides a GaN-based semiconductor structure, including: a substrate: a channel layer and a barrier layer sequentially stacked on the substrate from bottom to up, where the channel layer and the barrier layer each include a channel region, a source region and a drain region located on both sides of the channel region: one or more grooves provided in at least one of the source region or the drain region, where, for each groove of the one or more grooves, the groove extends below a heterojunction interface between the barrier layer and the channel layer, a bottom wall of the groove includes a first side edge adjacent to the channel region, a length of the first side edge is a first length, a length of an orthographic projection of the first side edge on a vertical plane in a length direction of the channel region is a second length, the first length is larger than the second length: a source region N-type ion heavily-doped layer located in the source region and a drain region N-type ion heavily-doped layer located in the drain region, where the source region N-type ion heavily-doped layer at least fills a first groove of the one or more grooves located in the source region, and the drain region N-type ion heavily-doped layer at least fills a second groove of the one or more grooves located in the drain region; and a gate electrode located in the channel region of the barrier layer, a source electrode located on the source region N-type ion heavily-doped layer, and a drain electrode located on the drain region N-type ion heavily-doped layer.

DETAILED DESCRIPTION OF THE EMBODIMENTS

Figure 1A:
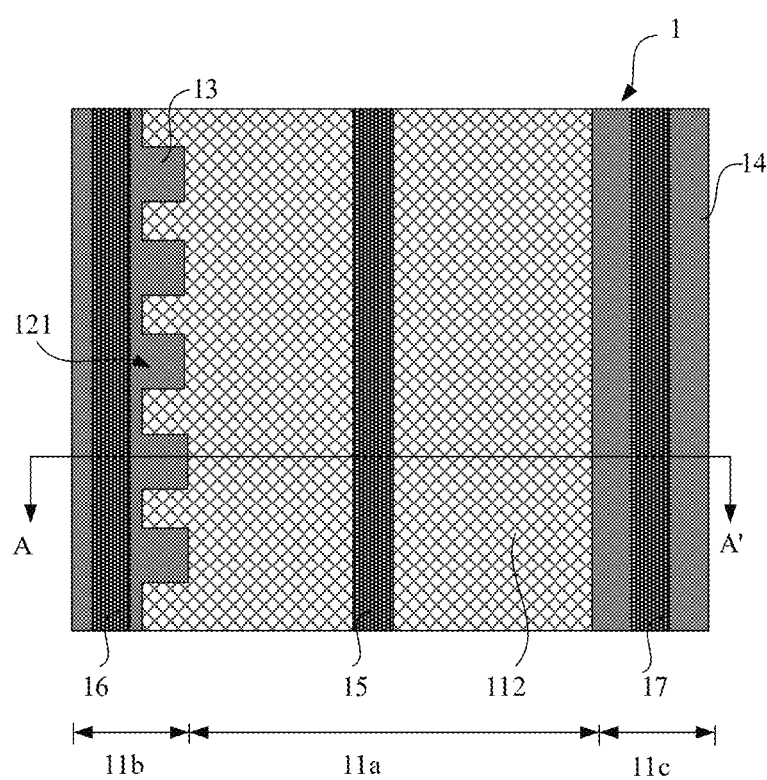
FIG. 1A is a schematic top view illustrating a GaN-based semiconductor structure according to a first embodiment of the present disclosure.
Figure 1B:
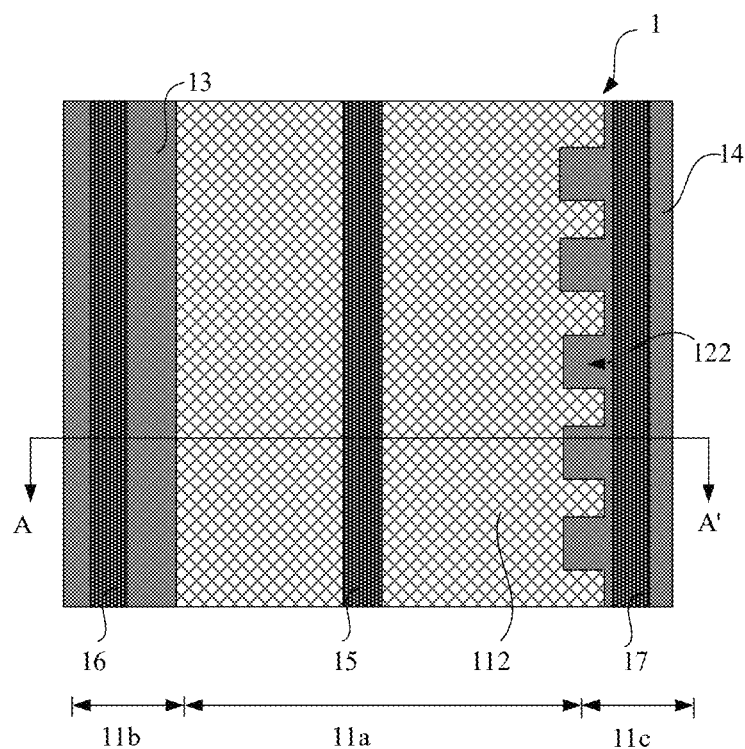
FIG. 1B is a schematic top view illustrating a GaN-based semiconductor structure according to a first embodiment of the present disclosure.
Figure 1C:
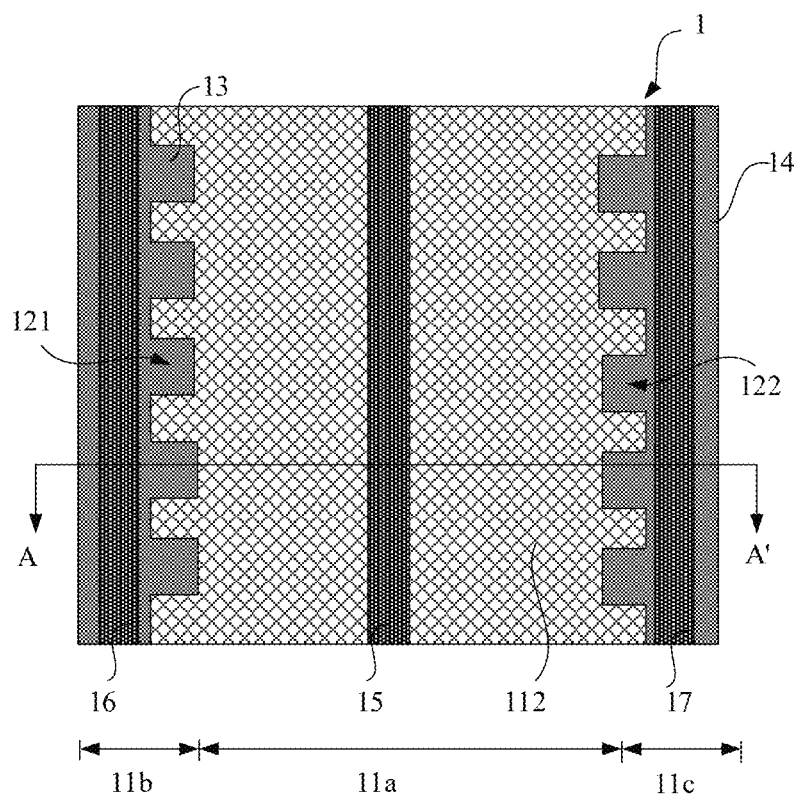
FIG. 1C is a schematic top view illustrating a GaN-based semiconductor structure according to a first embodiment of the present disclosure.

In order to make the objects, features, and advantages of the present disclosure more obvious and understandable, specific embodiments of the present disclosure will be described in detail below with reference to the accompanying drawings.

In processes for manufacturing GaN-based HEMT devices, a source-drain ohmic contact process is one of key technologies, which directly affects frequency and power performance of the devices. Secondary epitaxial growth of N-type ion heavily-doped GaN layers in ohmic contact regions to reduce ohmic contact resistivity and improve surface morphology has become a new international process in recent years. Ohmic contact resistance achieved by this process mainly includes contact resistance between metals and N-type ion heavily-doped layers, body resistance of the N-type ion heavily-doped layers, and contact resistance between the N-type ion heavily-doped layers and side walls of heterojunction.

Inventors found that: 1) a magnitude order of resistance between a source electrode and a source region N-type ion heavily-doped layer is about two decimal places: 2) a magnitude order of self-resistance of the source region N-type ion heavily-doped layer is about four decimal places: 3) a magnitude order of resistance between the source region N-type ion heavily-doped layer and a heterojunction interface is about one decimal place: 4) a magnitude order of flowing resistance of a two-dimensional electron gas (2DEG) at the heterojunction interface is about two decimal places: 5) a magnitude order of resistance between a drain region N-type ion heavily-doped layer and the heterojunction interface is about one decimal place: 6) a magnitude order of self-resistance of the drain region N-type ion heavily-doped layer is about four decimal places: 7) a magnitude order of resistance between a drain electrode and the drain region N-type ion heavily-doped layer is about two decimal places. It can be seen that 3) the resistance between the source region N-type ion heavily-doped layer and the heterojunction interface and 5) the resistance between the drain region N-type ion heavily-doped layer and the heterojunction interface are much larger than resistance of other factors. Contact between N-type ion heavily-doped layers and side walls of heterojunction directly affects contact resistance between the N-type ion heavily-doped layers and the side walls of heterojunction. This contact resistance has greatest impacts on overall ohmic contact, so that effectively reducing the contact resistance between the N-type ion heavily-doped layer and the side walls of heterojunction can significantly reduce overall on-resistance of the GaN-based HEMT devices.

Based on the above analysis, in the embodiments of the present disclosure, a part of at least one of a source region N-type ion heavily-doped layer or a drain region N-type ion heavily-doped layer extend below a heterojunction interface between a barrier layer and a channel layer, and a length of a first side edge adjacent to a channel region in a bottom wall of the source region N-type ion heavily-doped layer is increased, and/or a length of a second side edge adjacent to a channel region in a bottom wall of the drain region N-type ion heavily-doped layer is increased. In this way, a collection area of a two-dimensional electron gas in a path from a source electrode to a channel and/or from the channel to a drain electrode can be increased, thereby reducing the on-resistance.

Figure 2:
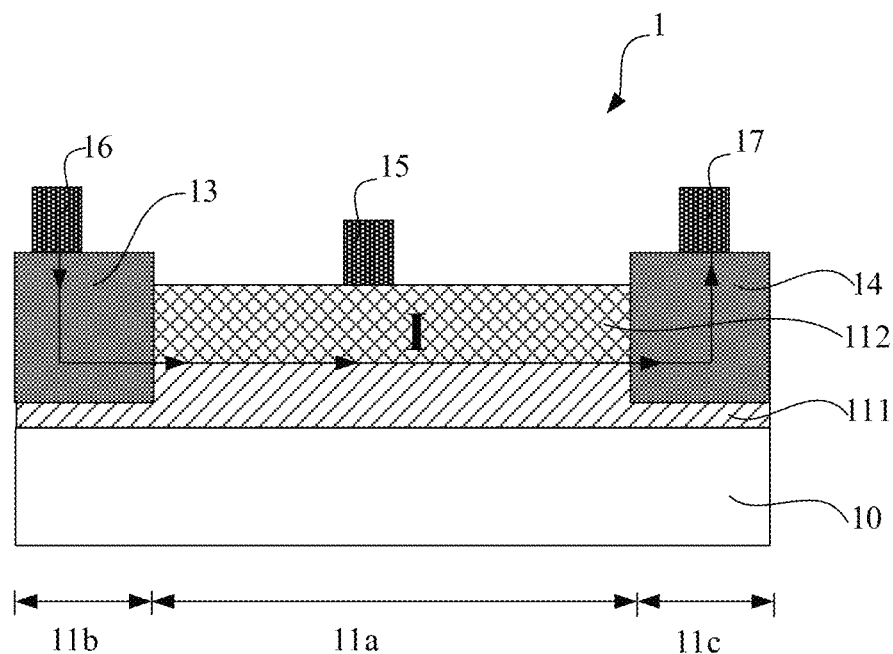
FIG. 2 is a cross-sectional view taken along line A-A' in FIG. 1A.
Figure 3:
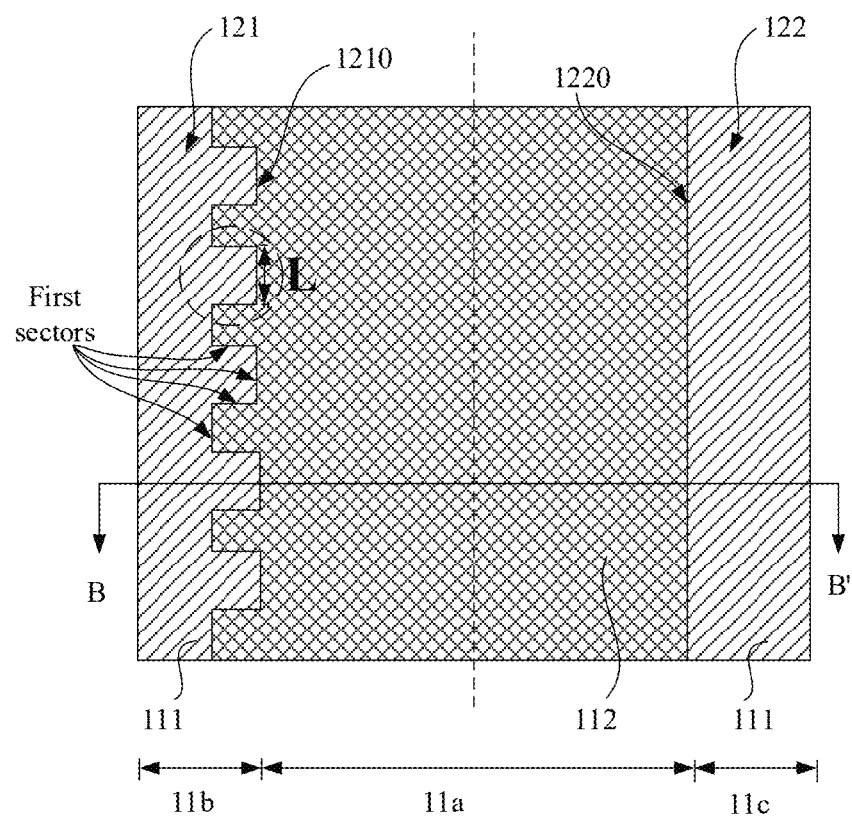
FIG. 3 is a schematic view illustrating a semiconductor structure after a gate electrode, a source electrode, a drain electrode, a source region N-type ion heavily-doped layer, and a drain region N-type ion heavily-doped layer in FIG. 1A are removed.
Figure 4:
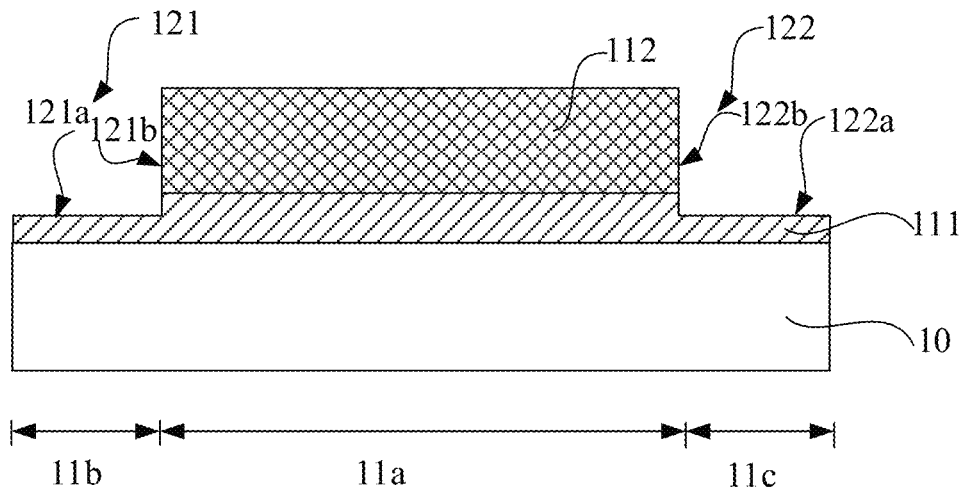
FIG. 4 is a cross-sectional view taken along line B-B' in FIG. 3.

FIG. 1A is a schematic top view illustrating a GaN-based semiconductor structure according to a first embodiment of the present disclosure. FIG. 2 is a cross-sectional view taken along line A-A' in FIG. 1A. FIG. 3 is a schematic view illustrating a semiconductor structure after a gate electrode, a source electrode, a drain electrode, a source region N-type ion heavily-doped layer, and a drain region N-type ion heavily-doped layer in FIG. 1A are removed. FIG. 4 is a cross-sectional view taken along line B-B' in FIG. 3.

Referring to FIG. 1A to FIG. 4, a GaN-based semiconductor structure 1 includes: a substrate 10; a channel layer 111 and a barrier layer 112 sequentially stacked on the substrate 10 in a thickness direction from bottom to up, where the channel layer 111 and the barrier layer 112 each include a channel region 11a, a source region 11b and a drain region 11c located on both sides of the channel region 11a: a first groove 121 located in the source region 11b and a second groove 122 located in the drain region 11c, where both the first groove 121 and the second groove 122 extend below a heterojunction interface between the barrier layer 112 and the channel layer 111, a bottom wall 121a of the first groove 121 includes a first side edge 1210 adjacent to the channel region 11a, a length of the first side edge 1210 is a first length, a length of an orthographic projection of the first side edge 1210 on a vertical plane (shown by a dotted line in FIG. 3) in a length direction of the channel region 11a is a second length, the first length is larger than the second length, a bottom wall 122a of the second groove 122 includes a second side edge 1220 adjacent to the channel region 11a, a length of the second side edge 1220 is a third length, a length of an orthographic projection of the second side edge 1220 on a vertical plane in a length direction of the channel region 11a is a fourth length, and the third length is equal to the fourth length: a source region N-type ion heavily-doped layer 13 and a drain region N-type ion heavily-doped layer 14, where the source region N-type ion heavily-doped layer 13 at least fills the first groove 121, and the drain region N-type ion heavily-doped layer 14 at least fills the second groove 122; and a gate electrode 15 located in the channel region 11a, a source electrode 16 located on the source region N-type ion heavily-doped layer 13, and a drain electrode 17 located on the drain region N-type ion heavily-doped layer 14. In some embodiments. FIG. 1A shows a schematic top view illustrating a GaN-based semiconductor structure where a first groove 121 is located in the source region 11b. FIG. 1B shows a schematic top view illustrating a GaN-based semiconductor structure where a second groove 122 is located in the drain region 11c. FIG. 1C shows a schematic top view illustrating a GaN-based semiconductor structure where the first groove 121 is located in the source region 11b and the second groove 122 is located in the drain region 11c. FIG. 1A to FIG. 1C show the situations that a groove is provided in at least one of the source region or the drain region.

A material of the substrate 10 can include a material such as sapphire, silicon carbide, silicon, or diamond.

The channel layer 111 and the barrier layer 112 form a heterojunction structure, and an interface between the channel layer 111 and the barrier layer 112 can form a two-dimensional electron gas.

Materials of both the channel layer 111 and the barrier layer 112 can include GaN-based materials. A band-gap of the barrier layer 112 is larger than a band-gap of the channel layer 111. The material of the barrier layer 112 can include AlGaN, and the material of the channel layer 111 can include GaN.

The channel region 11a includes a length direction and a width direction that are perpendicular to each other. Referring to FIG. 1A and FIG. 3, the length direction of the channel region 11a is a lateral direction in FIG. 1A. The width direction of the channel region 11a is a vertical direction in FIG. 1A.

In this embodiment, as shown in FIG. 4, the first groove 121 includes a first side wall 121b adjacent to the channel region 11a, and the first side wall 121b is a vertical side wall. The second groove 122 includes a second side wall 122b adjacent to the channel region 11a, and the second side wall 122b is also a vertical side wall.

Both the first groove 121 and the second groove 122 extending below the heterojunction interface between the barrier layer 112 and the channel layer 111 refers to: both the first groove 121 and the second groove 122 extending into the barrier layer 112 and a part of the channel layer 111 in the thickness direction.

Materials of both the source region N-type ion heavily-doped layer 13 and the drain region N-type ion heavily-doped layer 14 can be N-type ion heavily-doped GaN-based materials. The GaN-based materials are, for example, have a single-layer structure, and materials of the single-layer structure can include GaN. AlGaN, or InGaN. In an example, when the material of the single-layer structure is AlGaN, an aluminum (Al) amount in the single-layer structure gradually decreases from bottom to up in the thickness direction, where a maximum of the Al amount in a lowest part of the AlGaN layer is less than or equal to the Al amount in the barrier layer 112, such that a barrier height at an interface between the single-layer structure and the barrier layer 112 can be reduced.

The structure of the GaN-based materials can be a stacked structure. In an example, the stacked structure can include an AlGaN layer and a GaN layer from bottom to up in the thickness direction. The AlGaN layer can be a single-layer in order to improve an infiltration characteristic at an interface between the AlGaN layer and the barrier layer 112. For example, an Al amount in the AlGaN layer gradually decreases from bottom to up in the thickness direction, where a maximum of the Al amount in a lowest part of the AlGaN layer is less than or equal to the Al amount in the barrier layer 112, such that a barrier height at an interface between the AlGaN layer and the barrier layer 112 can be reduced. In another example, the stacked structure can be a structure including a GaN-based superlattice structure and a GaN layer. The GaN-based superlattice structure is, for example, a superlattice structure in which a GaN layer and an AlGaN layer are periodically alternately formed, or a superlattice structure in which a GaN layer and an InGaN layer are periodically alternately formed. By introducing the superlattice structure, a square resistance of a top GaN layer can be further reduced, and a concentration of a two-dimensional electron gas at a heterojunction interface can be increased through a polarization effect, while a migration rate of the two-dimensional electron gas can be improved. The GaN-based superlattice structure can be arranged as a lower layer, and the GaN layer is an upper layer, or the GaN-based superlattice structure is arranged in the middle of the GaN layer, or the stacked structure is completely replaced with the GaN-based superlattice structure.

It should be noted that the source region N-type ion heavily-doped layer 13 in the first groove 121 heavily-doped can be grown simultaneously on the bottom wall 121a and the first side wall 121b of the first groove 121, and the drain region N-type ion heavily-doped layer 14 in the second groove 122 can be grown simultaneously on the bottom wall 122a and the second side wall 122b of the second groove 122. For example, if the stacked structure includes an AlGaN layer and a GaN layer from bottom to up in the thickness direction, the AlGaN layer is first grown on the first side wall 121b and the second side wall 122b, because the material of the barrier layer 112 is also AlGaN, which is beneficial to reduce the contact resistance.

The growth of the source region N-type ion heavily-doped layer 13 and the drain region N-type ion heavily-doped layer 14 can include two methods: a) epitaxially growing an N-type ion heavily-doped layer on the entire surface of a heterojunction structure with the first groove 121 and the second groove 122, then removing the N-type ion heavily-doped layer in other region by etching, and only remaining the source region N-type ion heavily-doped layer 13 located in the source region 11b and the drain region N-type ion heavily-doped layer 14 located in the drain region 11c: b) forming a mask layer, such as a silicon dioxide layer, on a heterojunction structure outside the source region 11b and the drain region 11c, and using the mask layer as a mask, epitaxially growing an N-type ion heavily-doped layer on the heterojunction structure to obtain the source region N-type ion heavily-doped layer 13 located in the source region 11b and the drain region N-type ion heavily-doped layer 14 located in the drain region 11c.

N-type elements doped in the source region N-type ion heavily-doped layer 13 and the drain region N-type ion heavily-doped layer 14 can include at least one of Si, Ge, Sn. Se or Te.

The source region N-type ion heavily-doped layer 13 at least filling the first groove 121 refers to that the source region N-type ion heavily-doped layer 13 can just fully fill the first groove 121, or can fill the first groove 121 in a manner of protruding from the first groove 121.

The drain region N-type ion heavily-doped layer 14 at least filling the second groove 122 refers to that the drain region N-type ion heavily-doped layer 14 can just fully fill the second groove 122, or can fill the second groove 122 in a manner of protruding from the second groove 122.

Materials of the gate electrode 15, the source electrode 16, and the drain electrode 17 can be metal, such as Ti/Al/Ni/Au or Ni/Au. A schottky contact can be formed between the gate electrode 15 and the barrier layer 112. An ohmic contact can be formed between the source electrode 16 and the source region N-type ion heavily-doped layer 13, and between the drain electrode 17 and the drain region N-type ion heavily-doped layer 14.

In this embodiment, since the source region N-type ion heavily-doped layer 13 fills the first groove 121, the first side edge 1210 of the bottom wall 121a of the first groove 121 is the first side edge 1210 of a bottom wall 121a of the source region N-type ion heavily-doped layer 13: since the drain region N-type ion heavily-doped layer 14 fills the second groove 122, the second side edge 1220 of the bottom wall 122a of the second groove 122 is the second side edge 1220 of a bottom wall 122a of the drain region N-type ion heavily-doped layer 14.

Referring to FIG. 3, in this embodiment, the first side edge 1210 is in a shape of a broken line, and the broken line includes left and right extension line segments, and up and down extension line segments. The left and right extension line segments are parallel to a length direction of the channel region 11a. The up and down extension line segments are parallel to a width direction of the channel region 11a. It is assumed that each line segment has a same length of L. and one broken line unit is shown in a dotted circle. A total length of line segments included in one broken line unit is 4L. As the dotted circle in FIG. 3 shown, there is one up and down extension line segment of length L, two left and right extension line segments of length L. and two up and down extension line segments of length L/2. In other words, in FIG. 3, from the top part of the circle, a total length of line segments includes L/2 in the y-direction. L in the x-direction, L in the y-direction, L in the x-direction and L/2 in the y-direction. Referring to FIG. 2 and FIG. 3, when the gate electrode 15 is applied with a turn-on voltage, and current I flows from the source electrode 16 to the drain electrode 17, a contact area corresponding to a resistance between the source region N-type ion heavily-doped layer 13 and the heterojunction interface in one broken line unit is equal to: 4L*H, where H is a size of a contact surface between the heterojunction interface and the source region N-type ion heavily-doped layer 13 in a thickness direction.

Figure 5:
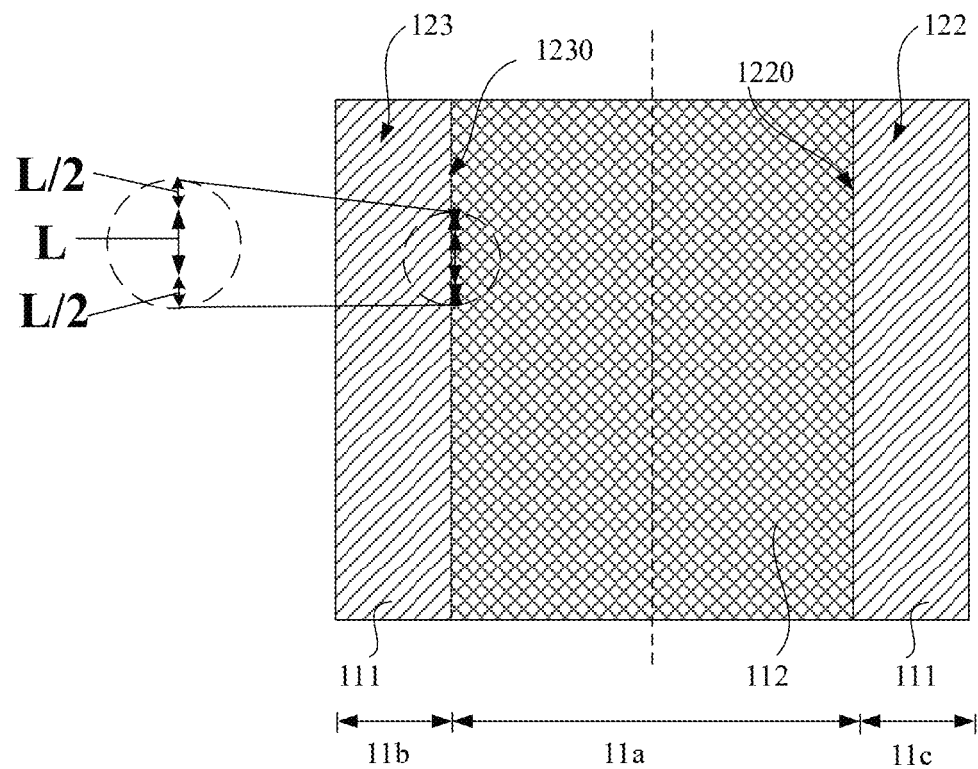
FIG. 5 is a schematic top view illustrating a GaN-based semiconductor structure in a comparative example after a gate electrode, a source electrode, a drain electrode, a source region N-type ion heavily-doped layer and a drain region N-type ion heavily-doped layer are removed.

FIG. 5 is a schematic top view illustrating a GaN-based semiconductor structure in a comparative example after a gate electrode, a source electrode, a drain electrode, a source region N-type ion heavily-doped layer and a drain region N-type ion heavily-doped layer are removed.

Referring to FIG. 5, in the comparative example, the source region 11b is provided with a first groove 123, and a bottom wall of the first groove 123 is rectangular. The bottom wall of the first groove 123 includes a first side edge 1230 close to the channel region 11a. The first side edge 1230 is a straight line parallel to a width direction of the channel region 11a (refer to a dotted line in FIG. 5). A contact area corresponding to a resistance between the source region N-type ion heavily-doped layer 13 and the heterojunction interface in a unit shown in a dotted circle is equal to: 2L*H, where H is a size of a contact surface between the heterojunction interface and the source region N-type ion heavily-doped layer 13 in a thickness direction. That is, in the comparative example of FIG. 5, the unit shown in a dotted circle in the comparative example corresponds to the broken line unit shown in a dotted circle in FIG. 3. The unit in the comparative example shown in FIG. 5 includes one up and down extension line segment of length L and two up and down extension line segments of length L/2. That is, the unit includes L/2 in the y-direction. L in the y-direction, and L/2 in the y-direction, in other words, the difference is due to the lengths in the x-direction of the protrusion.

It can be seen that, compared with the comparative example, in a cube with a width of the channel region 11a being a unit width, according to this embodiment, by increasing the length of the first side edge 1210, the resistance between the source region N-type ion heavily-doped layer 13 and the heterojunction interface is reduced by ½. As an increase in the length of the first side edge 1210 becomes larger, the resistance between the source region N-type ion heavily-doped layer 13 and the heterojunction interface decreases reciprocally.

In other embodiments, the shape of the broken line of the first side edge 1210 can be a jagged shape. That is, an angle between a line segment of the broken line and the length direction of the channel region 11a is less than 90 degrees.

Figure 6:
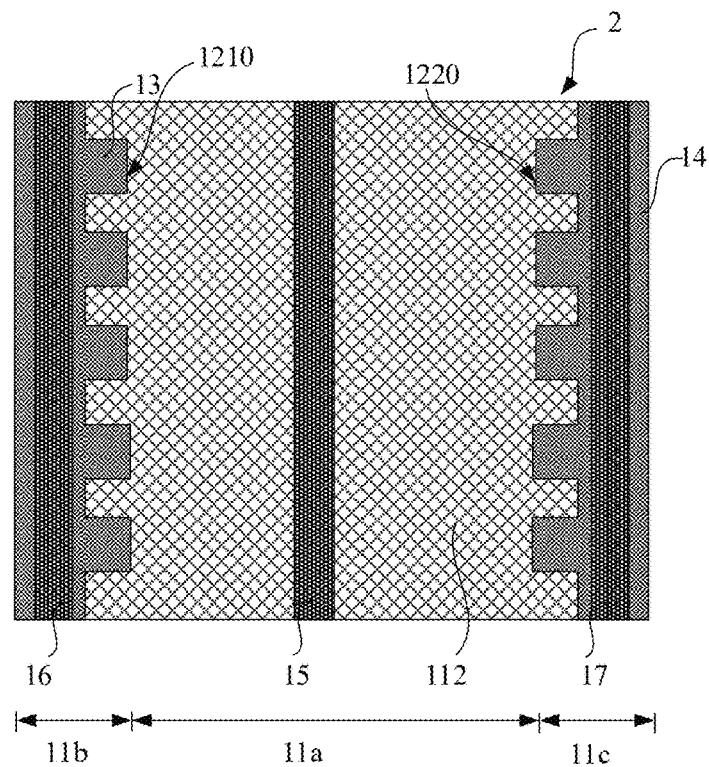
FIG. 6 is a schematic top view illustrating a GaN-based semiconductor structure according to a second embodiment of the present disclosure.
Figure 7:
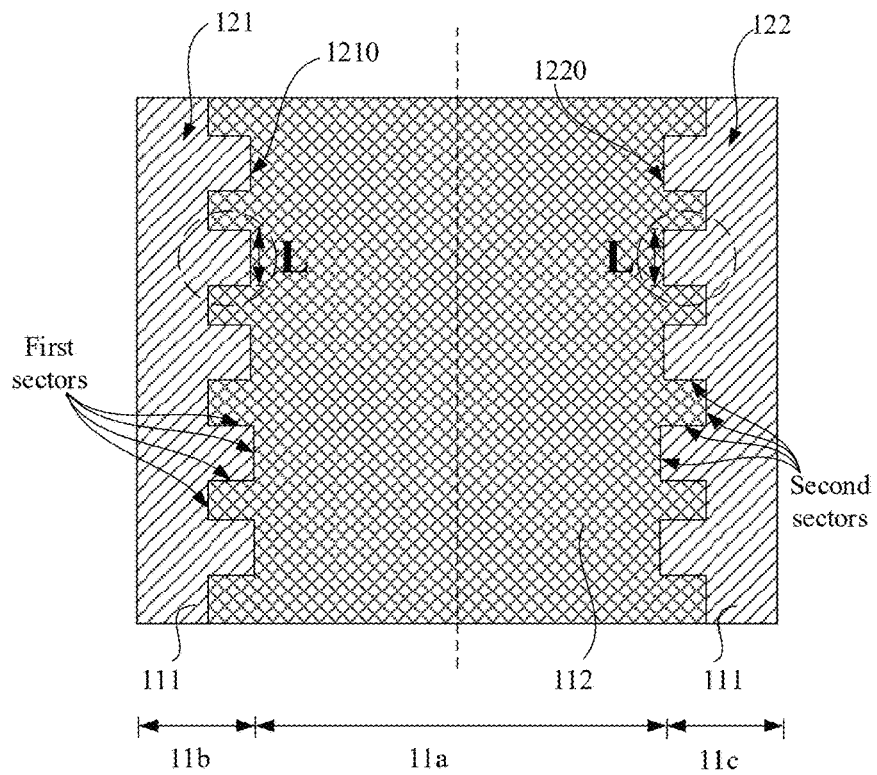
FIG. 7 is a schematic view illustrating a semiconductor structure after a gate electrode, a source electrode, a drain electrode, a source region N-type ion heavily-doped layer, and a drain region N-type ion heavily-doped layer in FIG. 6 are removed.

FIG. 6 is a schematic top view illustrating a GaN-based semiconductor structure according to a second embodiment of the present disclosure. FIG. 7 is a schematic view illustrating a semiconductor structure after a gate electrode, a source electrode, a drain electrode, a source region N-type ion heavily-doped layer, and a drain region N-type ion heavily-doped layer in FIG. 6 are removed.

Referring to FIG. 6 and FIG. 7, a difference between a GaN-based semiconductor structure 2 according to the second embodiment and the GaN-based semiconductor structure 1 according to the first embodiment lies in that: the third length is larger than the fourth length.

Referring to FIG. 2 and FIG. 7, when the gate electrode 15 is applied with a turn-on voltage, and current I flows from the source electrode 16 to the drain electrode 17, a contact area corresponding to a resistance between the source region N-type ion heavily-doped layer 13 and the heterojunction interface in one broken line unit is equal to: 4L*H. and a contact area corresponding to a resistance between the drain region N-type ion heavily-doped layer 14 and the heterojunction interface in one broken line unit is equal to: 4L*H. Compared with the comparative example shown in FIG. 5, in a unit cube with a width of the channel region 11a being a unit width, according to this example, by increasing the lengths of the first side edge 1210 and the second side edge 1220, a sum of the resistance between the source region N-type ion heavily-doped layer 13 and the heterojunction interface and the resistance between the drain region N-type ion heavily-doped layer 14 and the heterojunction interface is reduced by ½. Compared with the GaN-based semiconductor structure 1 according to the first embodiment, in a unit cube with a width of the channel region 11a being a unit width, according to this example, by increasing the lengths of the first side edge 1210 and the second side edge 1220, a sum of the resistance between the source region N-type ion heavily-doped layer 13 and the heterojunction interface and the resistance between the drain region N-type ion heavily-doped layer 14 and the heterojunction interface is further reduced. Therefore, compared with the GaN-based semiconductor structure 1 according to the first embodiment, the GaN-based semiconductor structure 2 according to the second embodiment can further reduce the on-resistance.

Figure 8:
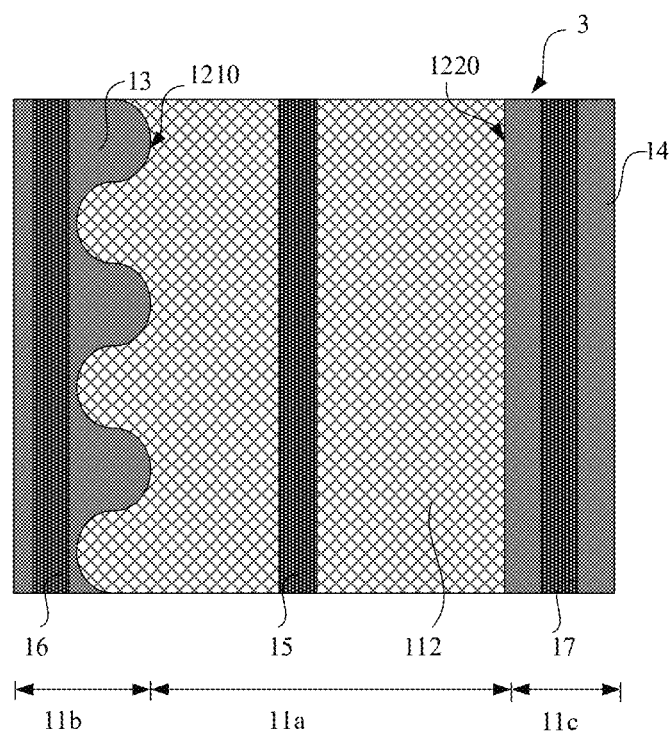
FIG. 8 is a schematic top view illustrating a GaN-based semiconductor structure according to a third embodiment of the present disclosure.

FIG. 8 is a schematic top view illustrating a GaN-based semiconductor structure according to a third embodiment of the present disclosure.

Referring to FIG. 8, a difference between a GaN-based semiconductor structure 3 according to the third embodiment and the GaN-based semiconductor structures 1 and 2 according to the first and second embodiments lies in that: the first side edge 1210 is wave-shaped.

In other embodiments, the second side edge 1220) can be wave-shaped.

Figure 9:
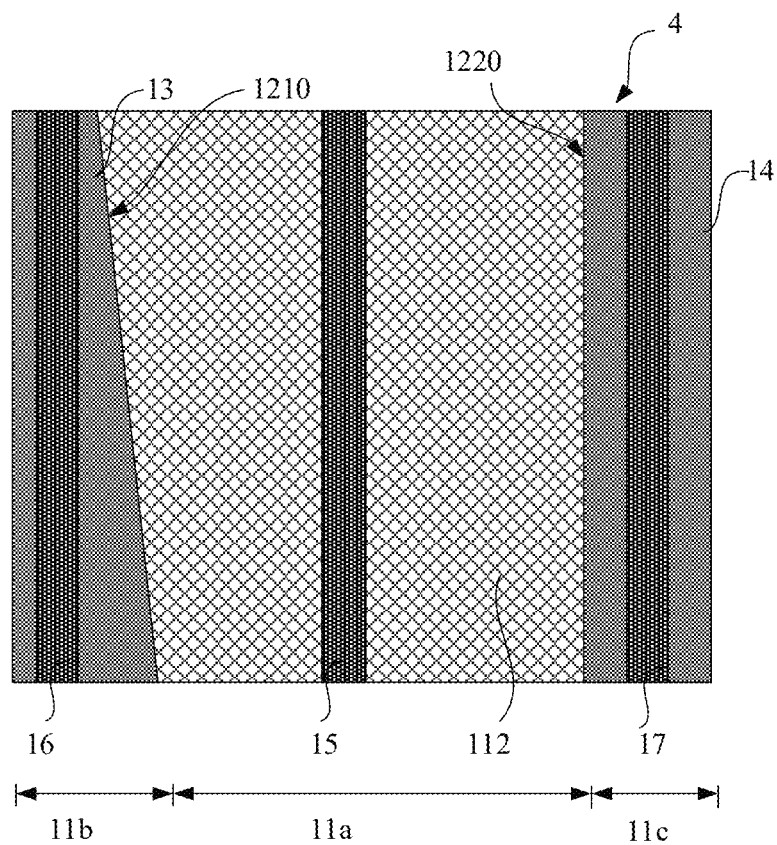
FIG. 9 is a schematic top view illustrating a GaN-based semiconductor structure according to a fourth embodiment of the present disclosure.

FIG. 9 is a schematic top view illustrating a GaN-based semiconductor structure according to a fourth embodiment of the present disclosure.

Referring to FIG. 9, a difference between a GaN-based semiconductor structure 4 according to the fourth embodiment and the GaN-based semiconductor structures 1, 2 and 3 according to the first, second and third embodiments lies in that: the first side edge 1210 is linear-shaped.

In other embodiments, the second side edge 1220 can be linear-shaped.

In other embodiments, the first side edge 1210 and the second side edge 1220 can have different shapes.

Figure 10:
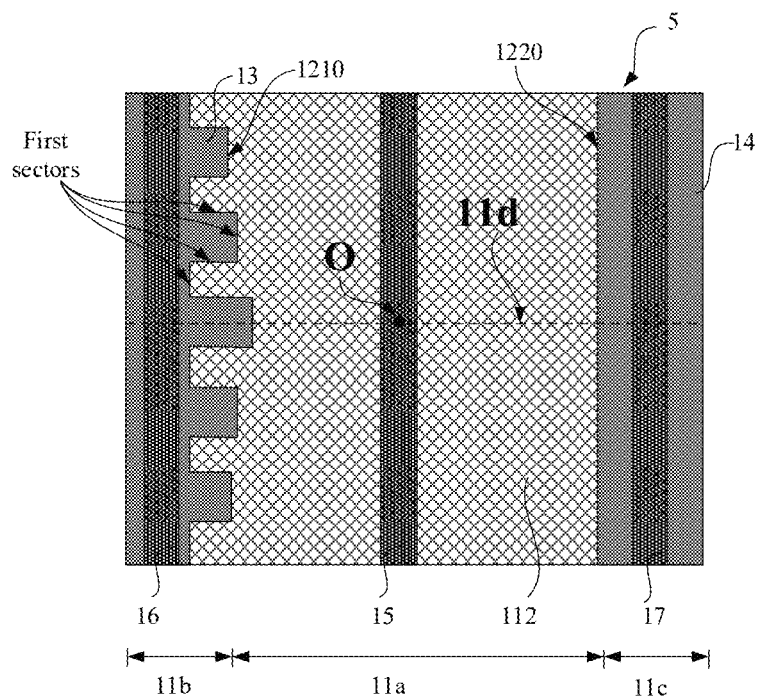
FIG. 10 is a schematic top view illustrating a GaN-based semiconductor structure according to a fifth embodiment of the present disclosure.

FIG. 10 is a schematic top view illustrating a GaN-based semiconductor structure according to a fifth embodiment of the present disclosure.

Referring to FIG. 10, differences between a GaN-based semiconductor structure 5 according to the fifth embodiment and the GaN-based semiconductor structures 1, 2, 3 and 4 according to the first to fourth embodiments lie in that: the first side edge 1210 includes a plurality of first sectors, and a shape of each first sector is linear; the channel region 11a has a center section 11d, and the center section 11d is a surface formed by a thickness direction and the length direction of the channel region 11a, and passes through a center O of the channel region 11a in a width direction; in a direction from being away from the center section 11d to the center section 11d, in a unit cube with a width of the channel region 11a being a unit width, lengths of the first sectors extending toward the channel region 11a are changed in an ascending order.

In other embodiments, in the direction from being away from the center section 11d to the center section 11d, in the unit cube with the width of the channel region 11a being the unit width, the lengths of the first sectors extending toward the channel region 11a are changed in a fluctuating trend or in a descending order. If the lengths of the first sectors extending toward the channel region 11a are changed in the fluctuating trend, there can be two or more fluctuating periods.

In other embodiments, the first side edge 1210 includes a plurality of first sectors, and at least one of the first sectors is wave-shaped or arc-shaped.

In other words, in the direction from being away from the center section 11d to the center section 11d, in the unit cube with the width of the channel region 11a being the unit width, total lengths of the first sectors are changed in a fluctuating trend or in an ascending order or in a descending order, operations such as etching and cutting will occur on the semiconductor structure, in the direction from being away from the center section 11d to the center section 11d, there will be problems of uneven defect distribution and uneven electric field distribution. By enabling the total lengths of the first sectors to be changed in the fluctuating trend or in the ascending order or in the descending order, a two-dimensional electron gas that passes through the source region 11b or the drain region 11c can be dispersed according to actual conditions in order to further balance the surface peak field electric value. When the total lengths of the first sectors are changed in the fluctuating trend, there can be two or more fluctuating periods.

In other embodiments, the second side edge 1220 can include a plurality of second sectors, at least one of the second sectors is wave-shaped, arc-shaped or linear-shaped, and in the direction from being away from the center section 11d to the center section 11d, in the unit cube with the width of the channel region 11a being the unit width, lengths of the second sectors extending toward the channel region 11a are changed in an ascending order or in a fluctuating trend or in a descending order, or total lengths of the second sectors are changed in an ascending order or in a fluctuating trend or in a descending order. When the length of the second sector extending toward the channel region 11a are changed in the fluctuating trend, there can be two or more fluctuating periods. When the total lengths of the second sectors are changed in the fluctuating trend, there can be two or more fluctuating periods.

In other embodiments, the first side edge 1210 and the second side edge 1220 can have different shapes.

Figure 11:
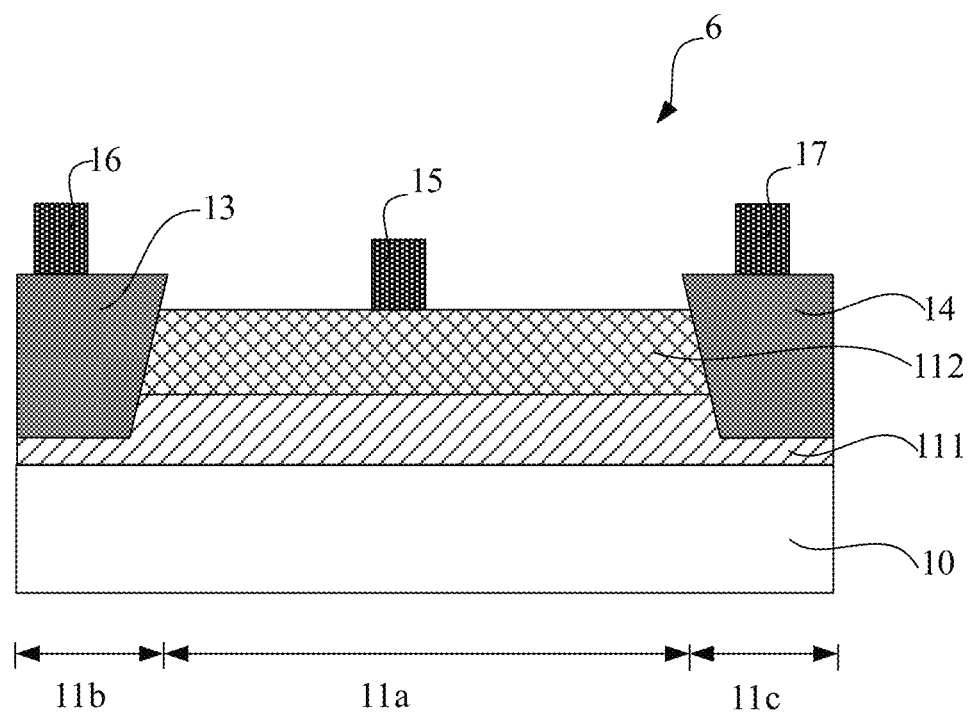
FIG. 11 is a schematic cross-sectional view illustrating a GaN-based semiconductor structure according to a sixth embodiment of the present disclosure.
Figure 12:
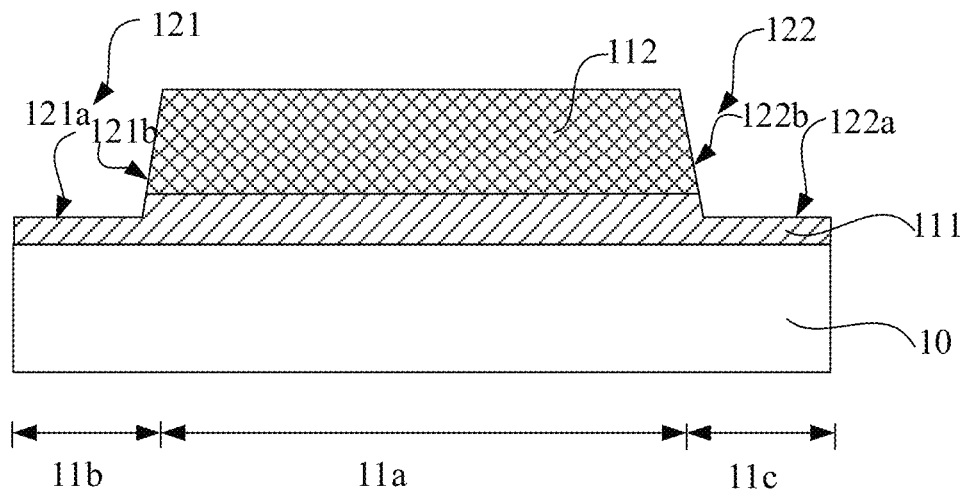
FIG. 12 is a schematic view illustrating a semiconductor structure after a gate electrode, a source electrode, a drain electrode, a source region N-type ion heavily-doped layer, and a drain region N-type ion heavily-doped layer in FIG. 11 are removed.

FIG. 11 is a schematic cross-sectional view illustrating a GaN-based semiconductor structure according to a sixth embodiment of the present disclosure. FIG. 12 is a schematic view illustrating a semiconductor structure after a gate electrode, a source electrode, a drain electrode, a source region N-type ion heavily-doped layer, and a drain region N-type ion heavily-doped layer in FIG. 11 are removed.

Referring to FIG. 11 and FIG. 12, differences between a GaN-based semiconductor structure 6 according to the sixth embodiment and the GaN-based semiconductor structures 1, 2, 3, 4 and 5 according to the first to fifth embodiments lie in that: the first side wall 121b extends further toward the channel region 11a at an opening of the first groove 121 than at the bottom wall 121a of the first groove 121, and the first side wall 121b is inclined in a direction from the opening of the first groove 121 to the bottom wall 121a of the first groove 121; the second side wall 122b extends further toward the channel region 11a at an opening of the second groove 122 than at the bottom wall 122a of the second groove 122, and the second side wall 122b is inclined in a direction from the opening of the second groove 122 to the bottom wall 122a of the second groove 122.

Compared with the vertical side walls, the first side wall 121b and the second side wall 122b are inclined, which can increase the contact area corresponding to the resistance between the source region N-type ion heavily-doped layer 13 and the heterojunction interface, and the contact area corresponding to the resistance between the drain region N-type ion heavily-doped layer 14 and the heterojunction interface, thereby reducing the on-resistance. In addition, it is beneficial for the secondary epitaxial growth of the source region N-type ion heavily-doped layer 13 and the drain region N-type ion heavily-doped layer 14. Compared with completely vertical side walls, the inclined side walls can eliminate gaps between the source region N-type ion heavily-doped layer 13 and the heterojunction interface, and gaps between the drain region N-type ion heavily-doped layer 14 and the heterojunction interface, and greatly reduce the contact resistance.

In other embodiments, the first side wall 121b can be inclined, and/or the second side wall 122b can be inclined.

Figure 13:
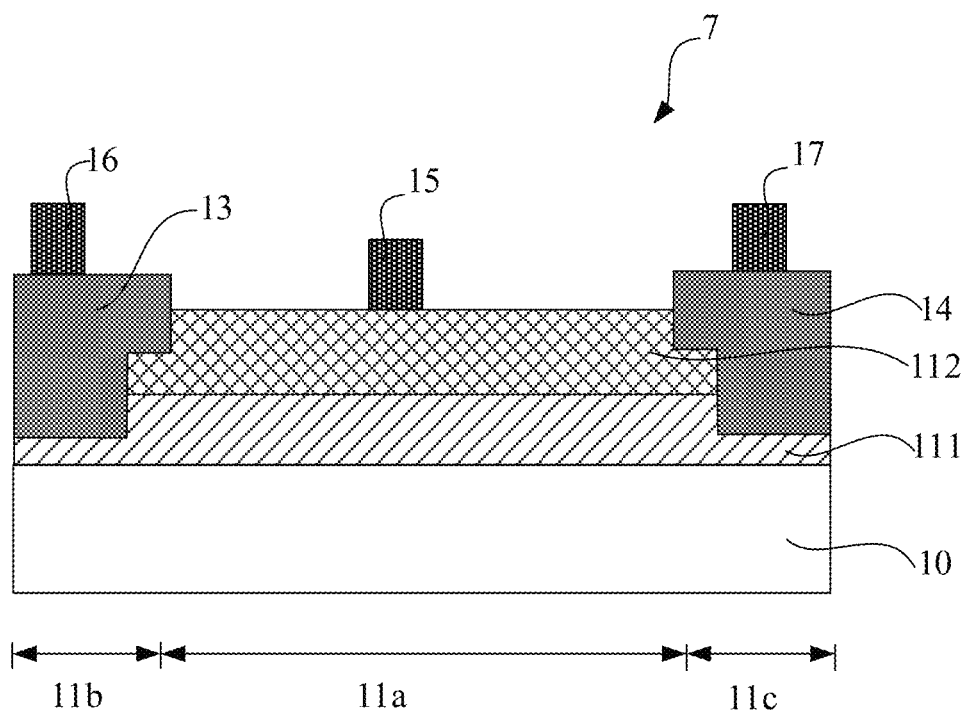
FIG. 13 is a schematic cross-sectional view illustrating a GaN-based semiconductor structure according to a seventh embodiment of the present disclosure.
Figure 14:
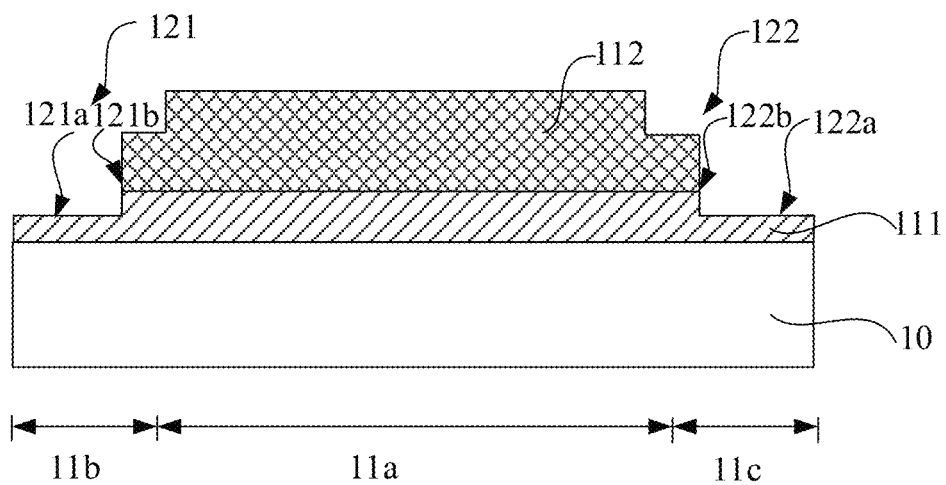
FIG. 14 is a schematic view illustrating a semiconductor structure after a gate electrode, a source electrode, a drain electrode, a source region N-type ion heavily-doped layer, and a drain region N-type ion heavily-doped layer in FIG. 13 are removed.

FIG. 13 is a schematic cross-sectional view illustrating a GaN-based semiconductor structure according to a seventh embodiment of the present disclosure. FIG. 14 is a schematic view illustrating a semiconductor structure after a gate electrode, a source electrode, a drain electrode, a source region N-type ion heavily-doped layer, and a drain region N-type ion heavily-doped layer in FIG. 13 are removed.

Referring to FIG. 13 and FIG. 14, differences between a GaN-based semiconductor structure 7 according to the seventh embodiment and the GaN-based semiconductor structure 6 according to the sixth embodiment lie in that: the first sidewall 121b is step-shaped in the direction from the opening of the first groove 121 to the bottom wall 121a of the first groove 121, and the second side wall 122b is step-shaped in the direction from the opening of the second groove 122 to the bottom wall 122a of the second groove 122. This is beneficial for the secondary epitaxial growth of the source region N-type ion heavily-doped layer 13 and the drain region N-type ion heavily-doped layer 14. Compared with completely vertical side walls, the step-shaped structure can eliminate gaps between the source region N-type ion heavily-doped layer 13 and the heterojunction interface, and gaps between the drain region N-type ion heavily-doped layer 14 and the heterojunction interface, improve the contact quality between the N-type ion heavily-doped layers and the heterojunction interface during the secondary epitaxial growth of the N-type ion heavily-doped layers, and greatly reduce the contact resistance.

In other embodiments, the first side wall 121b can be step-shaped, and/or the second side wall 122b can be step-shaped.

Figure 15:
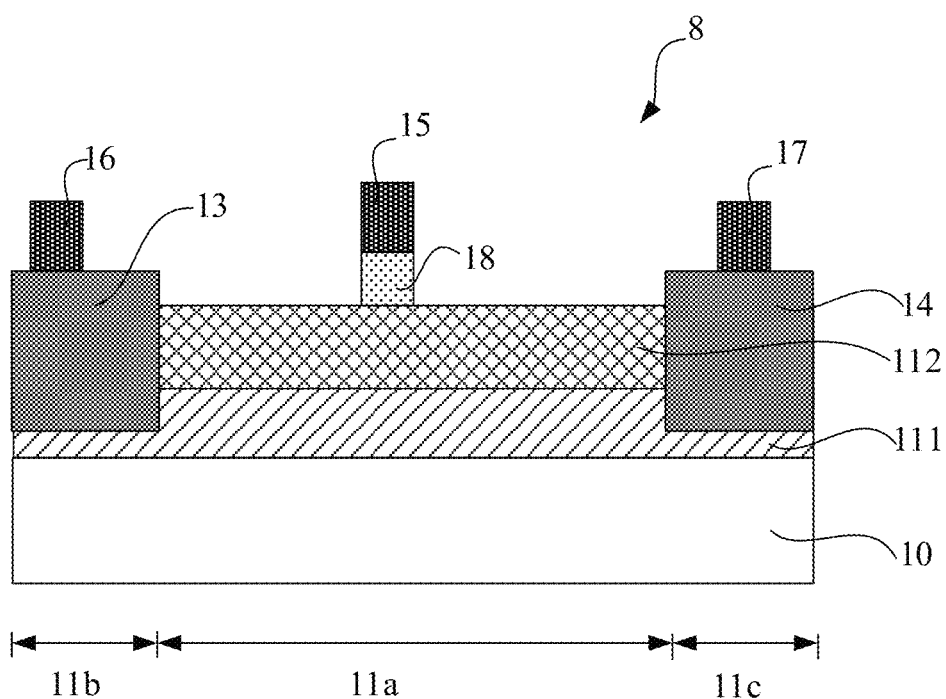
FIG. 15 is a schematic cross-sectional view illustrating a GaN-based semiconductor structure according to an eighth embodiment of the present disclosure.

FIG. 15 is a schematic cross-sectional view illustrating a GaN-based semiconductor structure according to an eighth embodiment of the present disclosure.

Referring to FIG. 15, a difference between a GaN-based semiconductor structure 8 according to the eighth embodiment and the GaN-based semiconductor structures 1, 2, 3, 4, 5, 6 and 7 according to the first to seventh embodiments lies in that: a P-type semiconductor layer 18 is provided between the gate electrode 15 and the barrier layer 112.

Side walls of the P-type semiconductor layer 18 can be aligned with or be slightly wider than side walls of the gate electrode 15.

Materials of the P-type semiconductor layer 18 can be GaN-based materials, and P-type doped elements can include at least one of (magnesium) Mg, zinc (Zn), calcium (Ca), strontium (Sr) or barium (Ba).

The P-type semiconductor layer 18 can provide holes, and consume excess two-dimensional electron gas at the heterojunction interface to form an enhanced device.

Figure 16:
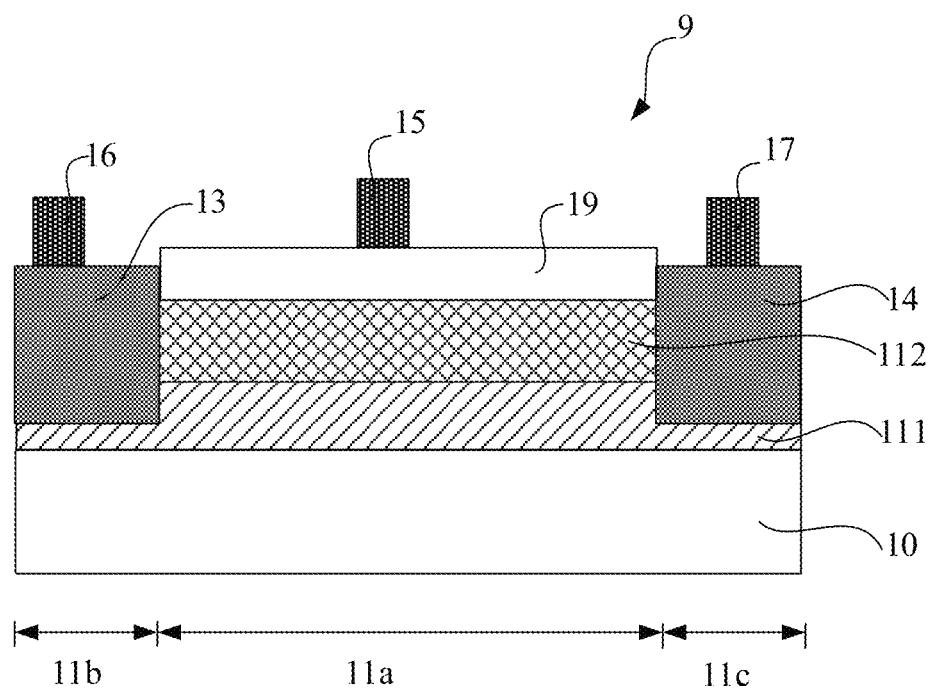
FIG. 16 is a schematic cross-sectional view illustrating a GaN-based semiconductor structure according to a ninth embodiment of the present disclosure.

FIG. 16 is a schematic cross-sectional view illustrating a GaN-based semiconductor structure according to a ninth embodiment of the present disclosure.

Referring to FIG. 16, a difference between a GaN-based semiconductor structure 9 according to the ninth embodiment and the GaN-based semiconductor structure 8 according to the eighth embodiment lies in that: a gate insulation layer 19 is provided between the gate electrode 15 and the barrier layer 112.

Materials of the gate insulation layer 19 can include at least one of silicon dioxide, silicon nitride or hafnium oxide.

The gate insulation layer 19 can enable the GaN-based semiconductor structure 9 to form an MIS (Metal insulator Semiconductor) device.

Although the present disclosure is described above, the disclosure is not limited thereto. Any person skilled in the art can make various changes and modifications without departing from the spirit and scope of the present disclosure. Therefore, the protection scope of the present disclosure should be based on the scope defined by the claims.

The invention claimed is:

1. A GaN-based semiconductor structure, comprising:
a substrate;
a channel layer;
a barrier layer, wherein the channel layer and the barrier layer are sequentially stacked on the substrate from bottom to top, and the channel layer and the barrier layer each include a channel region, a source region and a drain region located on both sides of the channel region;
a groove provided in at least one of the source region or the drain region, wherein, the groove extends below a heterojunction interface between the barrier layer and the channel layer, a bottom wall of the groove comprises a first side edge adjacent to the channel region, a length of the first side edge is a first length, a length of an orthographic projection of the first side edge on a vertical plane in a length direction of the channel region is a second length, and the first length is larger than the second length;
a source region N-type ion heavily-doped layer located in the source region;
a drain region N-type ion heavily-doped layer located in the drain region, wherein the source region N-type ion heavily-doped layer at least fills the groove;
a gate electrode located in the channel region of the barrier layer;
a source electrode located on the source region N-type ion heavily-doped layer; and
a drain electrode located on the drain region N-type ion heavily-doped layer;
wherein the first side edge includes a plurality of first sectors, and at least one of the first sectors is wave-shaped, arc-shaped, or linear-shaped;
wherein the channel region has a center section, and the center section is a surface formed by a thickness direction and a length direction of the channel region, and passes through a center of the channel region in a width direction; in a direction from being away from the center section to the center section, in respective unit widths along the width direction of the channel region, total lengths of contours of the first sectors in the respective unit widths close to the channel region are changed in a fluctuating trend or in an ascending order or in a descending order.

2. The GaN-based semiconductor structure according to claim 1, wherein in the direction from being away from the center section to the center section, lengths of the first sectors in the respective unit widths extending toward the channel region are changed in a fluctuating trend or in an ascending order or in a descending order.

3. The GaN-based semiconductor structure according to claim 1, wherein a first length of a groove in the source region is unequal to a first length of a groove in the drain region.

4. The GaN-based semiconductor structure according to claim 1, wherein a shape of a first side edge of the first groove located in the source region is different from a shape of a first side edge of the second groove located in the drain region.

5. The GaN-based semiconductor structure according to claim 1, wherein the groove comprises a first side wall adjacent to the channel region, and the first side wall extends farther toward the channel region at an opening of the groove than at the bottom wall of the groove.

6. The GaN-based semiconductor structure according to claim 5, wherein the first side wall is inclined in a direction from the opening of the groove to the bottom wall of the groove.

7. The GaN-based semiconductor structure according to claim 5, wherein the first side wall is step-shaped in a direction from the opening of the groove to the bottom wall of the groove.

8. The GaN-based semiconductor structure according to claim 1, wherein at least one of the source region N-type ion heavily-doped layer or the drain region N-type ion heavily-doped layer comprises a single-layer structure or a stacked layer structure.

9. The GaN-based semiconductor structure according to claim 1, wherein the gate electrode contacts the barrier layer.

10. The GaN-based semiconductor structure according to claim 1, wherein a P-type semiconductor layer is provided between the gate electrode and the barrier layer.

11. The GaN-based semiconductor structure according to claim 1, wherein a gate insulation layer is provided between the gate electrode and the barrier layer.

* * * * *